United States Patent
Hoffmann et al.

Patent Number: 5,253,209
Date of Patent: Oct. 12, 1993

[54] INTEGRATED SEMICONDUCTOR MEMORY

[75] Inventors: Kurt Hoffmann, Taufkirchen; Oskar Kowarik, Grafing; Rainer Kraus; Bernhard Lustig, both of München; Hans D. Oberle, Puchheim, all of Fed. Rep. of Germany

[73] Assignee: Siemens Aktiengesellschaft, Munich, Fed. Rep. of Germany

[21] Appl. No.: 736,468

[22] Filed: Jul. 26, 1991

[51] Int. Cl.$^5$ .............................................. G11C 29/00
[52] U.S. Cl. .................................. 365/201; 365/149; 365/203
[58] Field of Search ................. 365/201, 149, 203, 190

[56] References Cited

U.S. PATENT DOCUMENTS

| | | | |
|---|---|---|---|
| 4,744,061 | 5/1988 | Takemae et al. | 365/201 |
| 4,885,748 | 12/1989 | Hoffmann | 365/201 |
| 4,896,322 | 1/1990 | Kraus | 365/201 |
| 4,920,515 | 4/1990 | Obata | 365/201 |
| 4,999,813 | 3/1991 | Ohtsuka | 365/201 |

FOREIGN PATENT DOCUMENTS

0283907 9/1988 European Pat. Off.
0286852 10/1988 European Pat. Off.

Primary Examiner—Eugene R. LaRoche
Assistant Examiner—A. Zarabian
Attorney, Agent, or Firm—Herbert L. Lerner; Laurence A. Greenberg

[57] ABSTRACT

An integrated semiconductor memory includes a memory cell field having memory cells disposed in matrix form, word lines and internal bit lines forming pairs of internal bit lines for triggering the memory cells. Internal weighting circuits are each assigned to a respective one of the internal bit line pairs. An external pair of bit lines is commonly assigned to the internal bit lines. Pairs of separation transistors are each assigned to a respective one of the internal bit line pairs for electrical separation of the respective internal bit line pair from the external pair of bit lines. A bit line decoder triggers the pairs of separation transistors. An external weighting circuit is provided. A discriminator device and a precharging device are connected to the external bit line pair. The internal bit lines of each pair of internal bit lines are triggered separately from one another. The internal bit lines of each pair of internal bit lines are connected to the external bit line pair separately from one another.

13 Claims, 5 Drawing Sheets

INTEGRATED SEMICONDUCTOR MEMORY

The invention relates to an integrated semiconductor memory, having memory cells disposed in matrix form in a memory cell field, which are triggerable through word lines and internal bit lines forming pairs of internal bit lines, one internal weighting circuit per internal bit line pair, one pair of separation transistors per internal bit line pair for the electrical separation of the internal bit line pair from an external pair of bit lines that are common to the internal bit lines, a bit line decoder for triggering the pairs of separation transistors, an external weighting circuit, and a discriminator device and a precharging device which are connected to the external bit line pair.

Modern integrated semiconductor memories contain a great number of memory cells. For instance, modern DRAMs have a memory capacity of 4 or 16 megabits. The testing time for typical function tests is known to increase linearly at least twice as fast as the number of memory cells increases. Many test patterns in fact produce a quadratic increase in testing time as memory capacity increases. Attempts have therefore already been made for some time to provide devices in the semiconductor memory itself that make it possible to shorten the testing time. For instance, that can be attained by operating a plurality of memory cells (which operate independently of one another in normal operation) parallel to one another in the test mode, ascertaining the outcome of testing internally in the memory, and finally making the results available as an error signal at the usual data output terminal.

A circuit configuration of that generic type is known, for instance, from Published European Application 0 283 907 A1 corresponding to U.S. Pat. No. 4,956,819. That device enables a simultaneous readout of (test) data from all of the memory cells disposed along one word line. Such a memory can accordingly be tested parallel, line by line. There are two disadvantageous aspects of the known circuit configuration: First, for the test mode, a potential that is quantitatively between the two typical supply potentials of the semiconductor memory must be furnished to trigger the separation transistors. That requires an independent generation of potential on the semiconductor chip itself. Second, in the test mode, it may happen that if an error occurs in one memory cell in a single word line, the internal weighting circuit assigned to the memory cell, after an initially correct weighting, will incorrectly flip into a state that indicates that the (actually defective) memory cell is functioning properly. One way in which that may happen, if the potential at the gate of the separation transistors is dimensioned disadvantageously, is that the (correct) data, which are read out from the other memory cells on the same word line and naturally reach the external bit line in the form of electrical potential over their internal bit lines and thus also reach the bit line connected to the defective memory cell, may pull or push this bit line to a potential that causes the internal weighting circuit to flip. Thus the internal weighting circuit flips from the state that originally correctly indicated the defective memory cell to a state that is meant to indicate a "good" cell.

It is accordingly an object of the invention to provide an integrated semi-conductor memory, which overcomes the hereinafore-mentioned disadvantages of the heretofore-known devices of this general type and which does so in such a way that the aforementioned error cannot occur.

With the foregoing and other objects in view there is provided, in accordance with the invention, an integrated semiconductor memory, comprising a memory cell field having memory cells disposed in matrix form, word lines and internal bit lines forming pairs of internal bit lines for triggering the memory cells, internal weighting circuits each being assigned to a respective one of the internal bit line pairs, an external pair of bit lines being commonly assigned to the internal bit lines, pairs of separation transistors each being assigned to a respective one of the internal bit line pairs for electrical separation of the respective internal bit line pair from the external pair of bit lines, a bit line decoder for triggering the pairs cf separation transistors, an external weighting circuit, a discriminator device and a precharging device connected to the external bit line pair, means for triggering the internal bit lines of each pair of internal bit lines separately from one another, and means for connecting the internal bit lines of each pair of internal bit lines to the external bit line pair separately from one another.

In accordance with another feature of the invention, the separate triggering means are part of the bit line decoder and operate as a function of a pair of test signals.

In accordance with a further feature of the invention, the bit line decoder has a decoder line, and the separate triggering means include a pair of series-connected switch transistors having sources connected in common to the decoder line, drains connected to gates of the separation transistors, and gates connected to the pair of test signals, for separate triggering of the pairs of separation transistors.

In accordance with an added feature of the invention, the separation transistors are first separation transistors, the separate triggering means trigger the transistors of each pair of first separation transistors in parallel with one another, and there are provided pairs of second separation transistors each being assigned to a respective one of the pairs of first separation transistors for separate triggering of the internal bit lines of each pair of internal bit lines, each of the first separation transistors being connected in series with a respective one of the second separation transistors, and in each pair of second separation transistors, one transistor being controlled by a first test signal and the other transistor being controlled by a second test signal.

In accordance with an additional feature of the invention, the pairs of second separation transistors are disposed between the memory cell field and the pairs of first separation transistors.

In accordance with yet another feature of the invention, the pairs of second separation transistors are disposed between the external bit line pair and the pairs of first separation transistors.

In accordance with yet a further feature of the invention, there is provided a common diffusion zone acting as respective source and drain zones for a transistor of a pair of second separation transistors and one transistor of a pair of first separation transistors connected thereto.

In accordance with yet an added feature of the invention, there are provided conductor tracks of the external bit line pair, and conductor tracks carrying the test signals and shielding with respect to the conductor tracks of the external bit line pair.

In accordance with a concomitant feature of the invention, in a test mode, one of the bit lines of the external bit line pair is precharged to logical 1, and the other of the bit lines of the external bit line pair is precharged to a potential being lower than the value of logical 1 by half an amount by which the one bit line of the external bit line pair precharged to logical 1 drops in the case of error.

Other features which are considered as characteristic for the invention are set forth in the appended claims.

Although the invention is illustrated and described herein as embodied in an integrated semiconductor memory, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
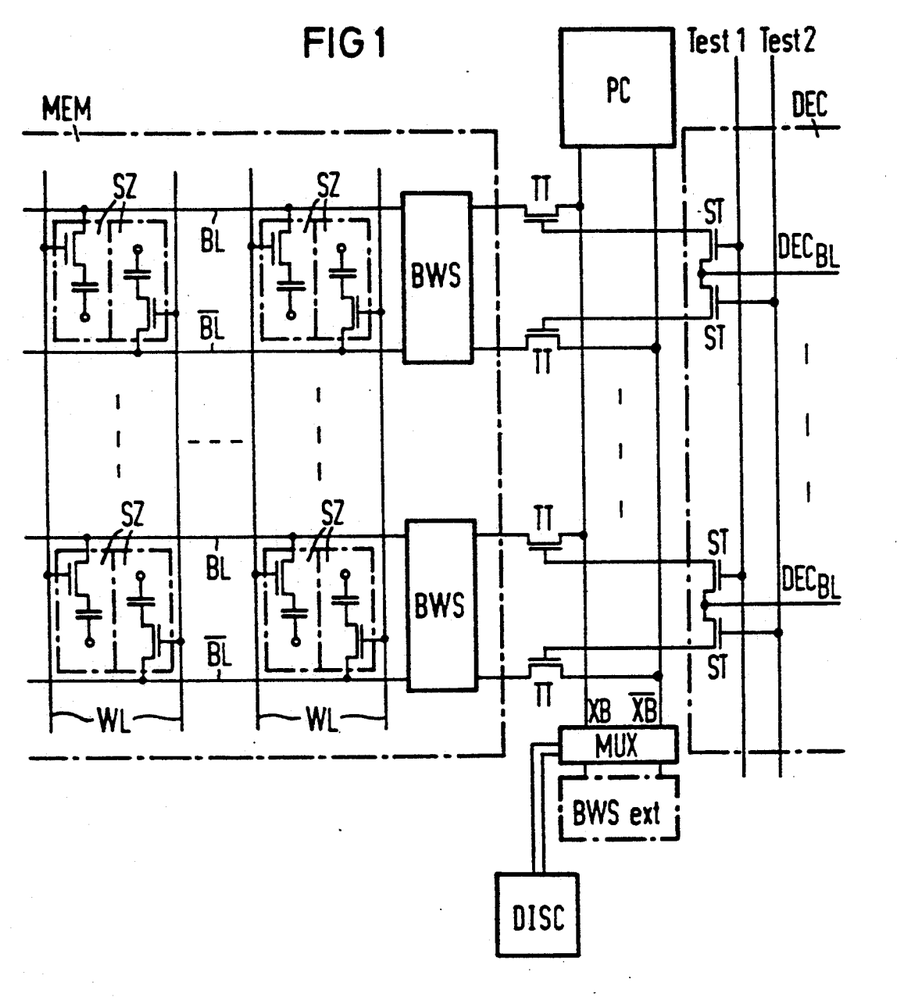
FIGS. 1-4 are schematic and block circuit diagrams of advantageous embodiments of the invention.

Referring now to the figures of the drawing in detail and first, particularly, to FIG. 1 thereof, there is seen a memory cell field MEM with memory cells SZ, pairs of internal bit lines BL, $\overline{BL}$, word lines WL, and internal weighting circuits BWS. For the sake of simplicity, only a few of these elements are shown. As usual, one internal bit line BL and one internal bit line $\overline{BL}$ each form a pair of internal bit lines BL, $\overline{BL}$, which are connected to one internal weighting circuit BWS. A pair of first separation transistors TT is connected between each pair of internal bit lines BL, $\overline{BL}$ along with the associated internal weighting circuit BWS on one hand, and one pair of external bit lines XB, $\overline{XB}$ on the other hand. The gates of each pair of separation transistors TT are connected to a bit line decoder DEC. In the prior art defined by Published European Application 0 283 907 A1 (the disclosure of which is incorporated into this description, to the extent that it can be combined with the present invention), the gates of each pair of separation transistors TT are connected in common to a bit line decoder DEC. Each pair of separation transistors TT serves to couple or decouple the pair of internal bit lines BL, $\overline{BL}$ assigned to it, to or from the pair of external bit lines XB, $\overline{XB}$, as a function of the applicable outlet of the bit line decoder DEC. This is equivalent to "select a pair of internal bit lines BL, $\overline{BL}$". The pair of external bit lines XB, $\overline{XB}$ is connected to an external weighting circuit BWSext.

Figure 2:
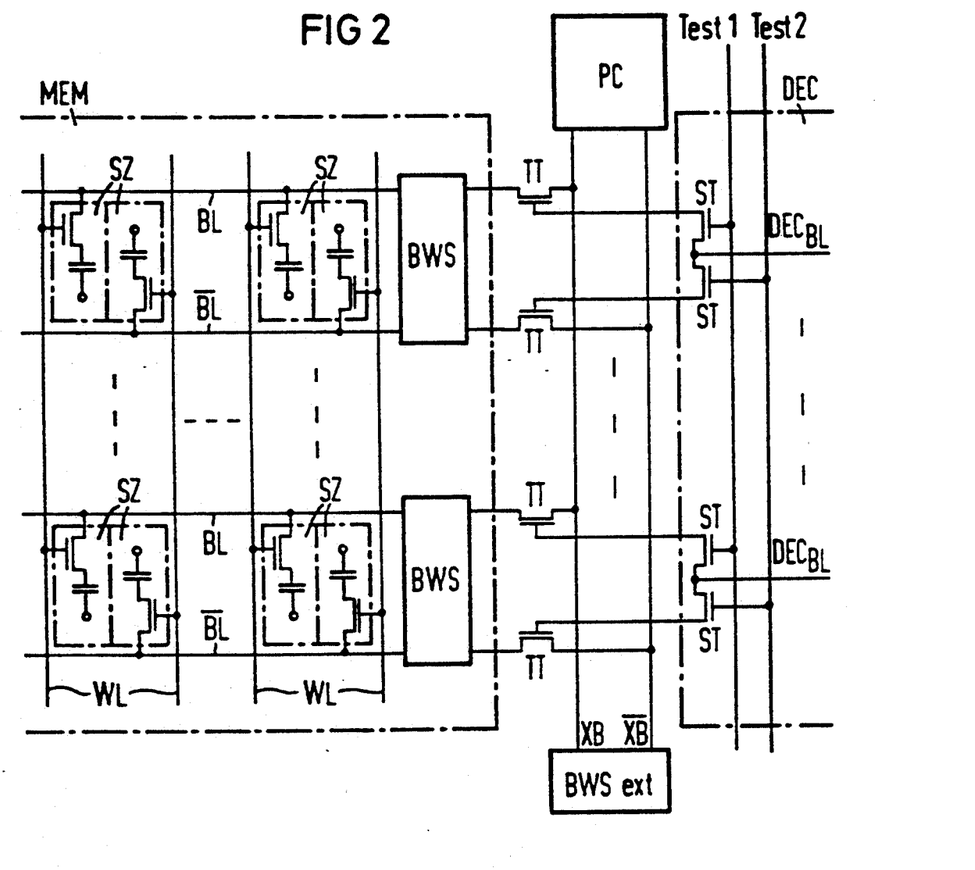

In first embodiments of the invention, shown in FIGS. 1 and 2, the separation transistors TT of each pair of separation transistors TT are triggerable separately from one another through their gates in a test mode. Thus in the test mode, either the first internal bit line BL or the second internal bit line WL of a pair of internal bit lines BL, $\overline{BL}$ is triggerable. This results in a connection with either the first external bit line XB or the second external bit line $\overline{XB}$ of the pair of external bit lines XB, $\overline{XB}$. If the bit line decoder DEC, for instance, has a device that enables triggering of one set (or the other) of separation transistors TT of either a plurality or all of the pairs of separation transistors TT in the test mode (decoders for this situation are known, for instance, from Published European Applications 0 282 975 corresponding to U.S. Pat. No. 4,906,994 and 0 283 908 corresponding to U.S. Pat. No. 4,855,621 which are owned by the corporate assignee of the instant application), then through the first set of internal bit lines BL (or the second internal bit lines $\overline{BL}$) in principle it is possible to read out the information parallel to one another on the first external bit line XB (or the second external bit line $\overline{XB}$) that is stored in either many or all of the memory cells SZ along one word line-WL. In order to provide separate triggering of the separation transistors TT, each pair of separation transistors TT is provided with a pair of switch transistors ST, for instance, which trigger the gates of the separation transistors TT.

Before individual advantageous embodiments are described in further detail, the mode of operation will first be described in detail: If a plurality or all of the memory cells SZ disposed on a selected word line WL are to be tested parallel to one another in the test mode, then the information (i.e., data) stored in all of the memory cells SZ along this word line WL is read out simultaneously from all of the memory cells SZ to the first set of internal bit lines BL (or second internal bit lines $\overline{BL}$, depending on whether the applicable memory cells SZ are connected to the first set of internal bit lines BL or the second set of internal bit lines $\overline{BL}$) connected to the memory cells SZ. Next, the data that have been read out are weighted in the internal weighting circuits BWS and amplified. As a result of the weighting, the weighting circuits BWS flip into a state corresponding to the datum to be weighted, in the generally known manner.

If, as is assumed in the example, a word line WL is triggered for reading out the data from memory cells SZ, the associated memory cells SZ of that line are connected to the first set of internal bit lines BL, then after weighting, if the cell is good, each of the first set of internal bit lines BL will then have the read-out datum (for example, "logical 1", as will be assumed for the ensuing description). Correspondingly, the other internal bit lines FL- have a datum, (in this example, "logical 0") complementary thereto. One external bit line XB of the pair of external bit lines XB, $\overline{XB}$, upon which a logical 1 is expected if the cell is good, will be precharged to logical 1 no later than at this instant. The other respective bit line XB can be precharged to logical 0. However, this is not necessary, as will be explained further below. For each pair of internal bit lines BL, $\overline{BL}$ in which a memory cell was to be read out, one separation transistor TT is now made conducting. If the cell is good, one external bit line XB of the external bit line pair XB, $\overline{XB}$, accordingly the one that has been precharged to logical 1, will maintain its state attained by a precharging device PC, similarly to what is described in Published European Application 0 283 907 A1. In case of error (that is, if at least one of the one set of internal bit lines BL has the datum logical 0), the potential of the one external bit line XB that has been originally precharged to logical 1 drops by an amount $\Delta U_{ERROR}$, to such an extent that an equilibrium is established over the remaining first set of internal bit lines BL, which have the correct value, logical 1. The external weighting circuit BWSext is deactivated during this process. A discriminator device DISC recognizes this drop, and it accordingly outputs an error signal.

As described thus far, the effect of the invention is accordingly similar to the action known from Published European Application 0 283 907 A1. Additionally, however, the present invention prevents flipping of whichever internal weighting circuit BWS has an associated memory cell SZ or internal bit line pair BL, $\overline{BL}$ with an error, into a state which (mistakenly) corresponds to the state that would prevail if the cell were good. In a configuration in which the bit lines BL, $\overline{BL}$ of a first pair of internal bit lines BL, $\overline{BL}$ are each simultaneously connected to the pair of external bit lines XB, $\overline{XB}$, or in other words in a configuration in accordance with the known prior art, this flipping would be caused by the second external bit line $\overline{XB}$. In the previously known prior art, that line has the state of logical 0, so that with the simultaneous connection of the bit lines BL, $\overline{BL}$ of one pair of internal bit lines BL, $\overline{BL}$, the other internal bit line BL, $\overline{BL}$ that is incorrectly at logical 1 is pulled to logical 0. However, that trips the flipping of the internal weighting circuit BWS. Nevertheless, the separate connectability of the bit lines BL, $\overline{BL}$ of each pair of internal bit lines BL, $\overline{BL}$ to the external bit line pair XB, $\overline{XB}$ according to the invention which is, for instance, achieved by separate triggering of the separation transistors TT per pair of separation transistors TT, reliably prevents this, because the other separation transistor TT of each pair is blocked. On the other hand, the blocking of the other separation transistor TT of each pair of separation transistors TT is the reason why it is unnecessary to precharge the other external bit line $\overline{XB}$ to logical 0. A more-detailed description of the function and mode of operation of the present invention in the event that memory cells SZ that are each connected to the other internal bit line $\overline{BL}$ are to be tested, will be omitted herein, because one skilled in the art will readily see that the above description logically applies for that case as well, by suitably changing the nomenclature (for instance, by replacing "the first set of internal bit lines $\overline{BL}$" with "the second set of internal bit lines $\overline{BL}$"; "the first set of external bit lines XB" with "the second set of external bit lines $\overline{XB}$"; and "the first separation transistor TT of the pairs of separation transistors TT" with "the second separation transistor TT of the pairs of separation transistors TT", and vice versa).

In the event that the memory cells SZ to be tested are intended to contain the value of logical 0, then as is also already described in reference to the first embodiment examples, use is made of the effect that for each internal bit line pair BL, $\overline{BL}$ on whichever internal bit line that is not connected to the particular memory cell SZ to be tested, a signal complementary to the read-out and amplified read signal, in other words in the event that the cell is good, forms a logical 1. Accordingly, in this case the second external bit line $\overline{XB}$ is precharged to logical 1. Moreover, the second internal bit lines $\overline{BL}$ are electrically conductively connected to the second external bit line $\overline{XB}$ through the respective second separation transistor TT, while the first separation transistors TT remain blocked.

From the above description pertaining to a test for a logical 1, one skilled in the art can see on his own that if the cell is good, the second external bit line $\overline{XB}$ maintains its value of logical 1, and accordingly the discriminator will not generate any error signal, while in the case of error the second external bit line $\overline{XB}$ will be pulled in terms of potential in the direction of logical 0 by the alreadydescribed amount $\Delta U_{ERROR}$. This in turn is recognized by the discriminator device DISC, which correspondingly activates the error signal. Flipping of the applicable internal weighting circuit BWS is reliably precluded in this case as well. Due to the similarity to the testing for logical 1 as already described, no further details need to be given herein.

Individual advantageous embodiments of the invention will be described in further detail below: the separate triggering of the bit lines BL, $\overline{BL}$ per pair of internal bit lines BL, $\overline{BL}$ by means of the separation transistors TT is advantageously effected in accordance with FIGS. 1 and 2 by the bit line decoder DEC, using one pair of test signals Test1 and Test2 and using one pair of switch transistors (per pair of internal bit lines BL, $\overline{BL}$). Instead of the switch transistors ST, transfer gates of parallel-connected p- and n-channel transistors with corresponding mutually complementary triggering may also be used. In the use of switch transistors ST as shown in FIGS. 1 and 2, one series circuit of the pair of switch transistors ST is provided for each (actual) decoder output line $DEC_{BL}$ (typical in the prior art) of the bit line decoder DEC. The sources of these switch transistors are connected in common to the actual decoder output $DEC_{BL}$. Their drains are connected to the gates of one or the other of the separation transistors TT. They now form the outputs of the thus-modified bit line decoder DEC. The gate of one switch transistor ST is connected to the first test signal Test1. The gate of the other switch transistor ST is connected to the second test signal Test2. Thus, in the test mode, one of the switch transistors ST of the pairs of switch transistors ST can always be blocked and another can always be made electrically conducting. This assures that in the test mode, both separation transistors TT of the associated pair of separation transistors TT will never be conductive at the same time. In contrast, in typical normal operation, all of the switch transistors ST can be made electrically conducting, so that the normal mode is not impaired as compared with a semiconductor memory of the known prior art.

As can readily be appreciated, the switch transistors ST have a certain additional space requirement in the integrated semiconductor memory. However, if the present invention is used for an integrated semiconductor memory that contains so-called "shared bit decoders" (where the memory cell field MEM is divided into a plurality of blocks that are triggered parallel to one another through a single bit line decoder), then the additional space required is needed only for this single bit line decoder, not for all of the blocks of the memory cell field MEM. Thus, the additional space required is minimal as compared with the space required for the entire integrated semiconductor memory.

Figure 6:
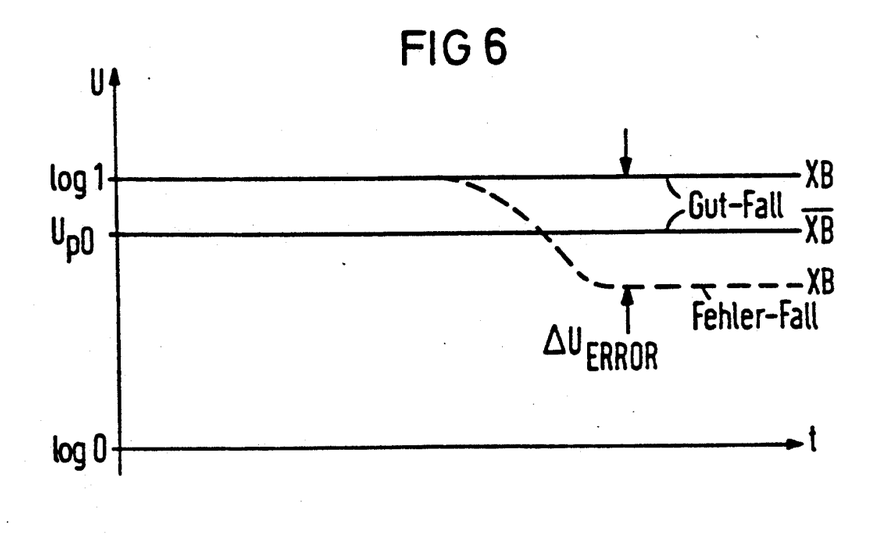
FIG. 6 is a graph used for explaining the operation of the device.

If, for the aforementioned test purposes, as shown in FIG. 6 for a further advantageous embodiment of the invention, the second external bit line $\overline{XB}$ (or XB) of the external bit line pair XB, $\overline{XB}$, whose precharging to logical 0 is unnecessary for the reasons given above, is nevertheless precharged to a precharging potential $U_{pO}$ that is less than the value of logical 1 by half the value $\Delta U_{ERROR}$ by which the one external bit line XB (or $\overline{XB}$) precharged to logical 1 drops in the case of error, as already described, and if the external weighting circuit BWSext is activated, then this circuit itself acts as a discriminator device DISC and flips to a state that is equivalent to the error state, as a result of which its output acts as an error signal. This makes is possible to eliminate a separate discriminator device DISC along with any possibly necessary multiplexing circuit MUX, as shown in FIG. 1 and in Published European Application 0 283 907 A1. This option is shown in FIG. 2.

Figure 3:
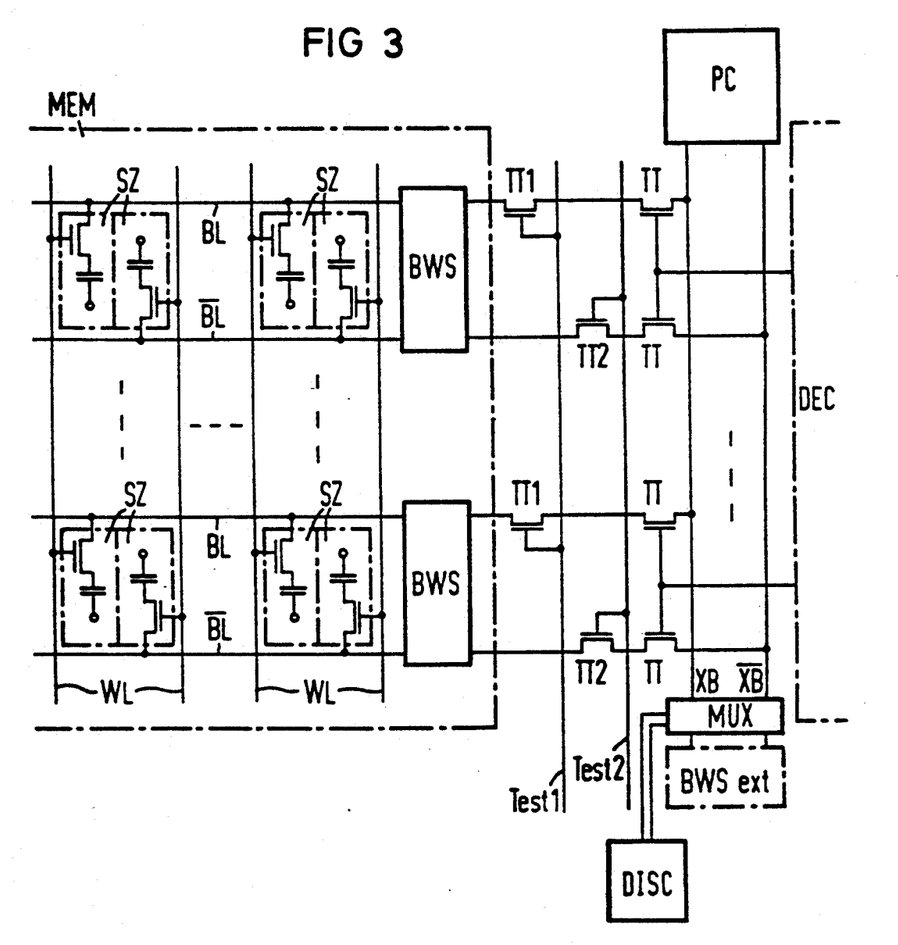
Figure 4:
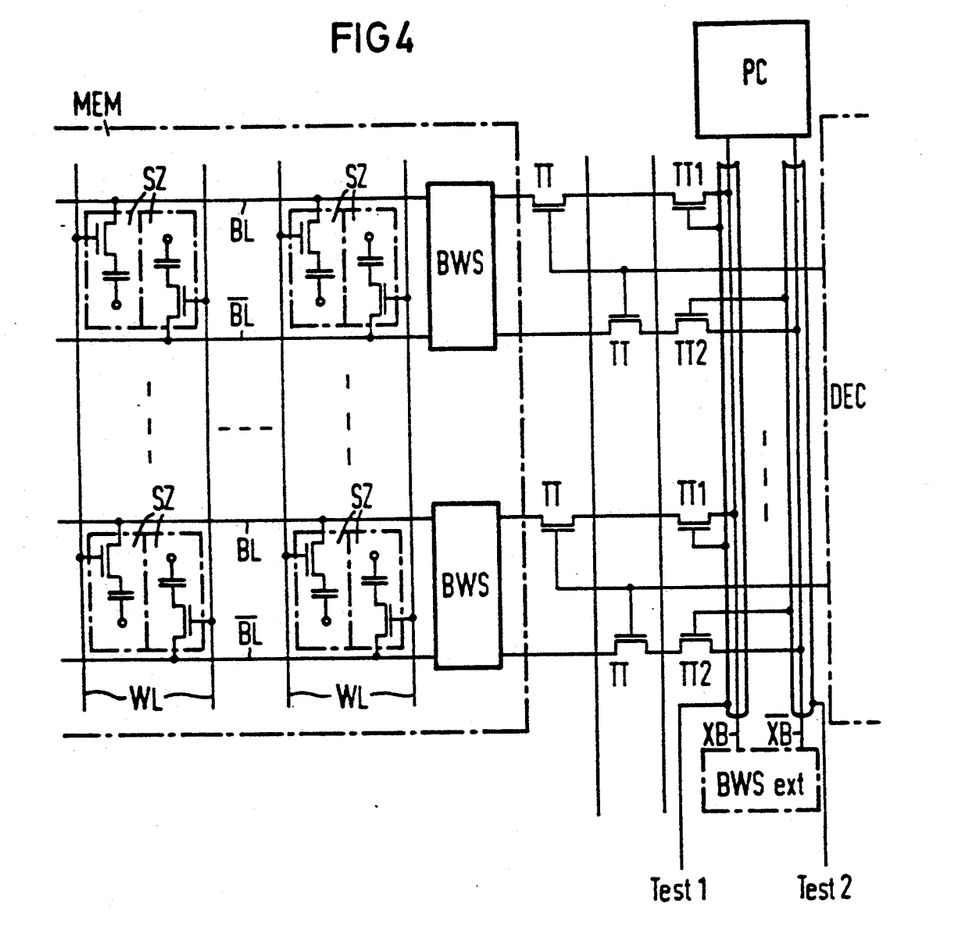

In the second embodiments, shown in FIGS. 3 and 4, the gates of each pair of separation transistors TT are connected in common to an output of the decoder DEC. Accordingly, the pairs of separation transistors TT are triggerable parallel to one another through their gates. To this end, the decoder DEC, for instance, has a device that makes it possible to trigger a plurality or all of the pairs of separation transistors TT in parallel in the test mode. As already noted, corresponding decoders are known, for instance, from Published European Applications 0 282 975 and 0 283 908 which are owned by the corporate assignee of the instant application. Thus in principle, the data that are stored in either many or all of the memory cells SZ along one word line WL can be read out parallel to one another. According to the invention, for separate triggering of the bit lines BL, $\overline{BL}$ of each internal pair of bit lines BL, $\overline{BL}$ in the test mode, a further pair of second separation transistors TT1, TT2 is provided per pair of separation transistors TT. The transistors TT1, TT2 of the separate pairs are connected in series with the applicable separation transistor TT of the first pair of separation transistors TT. During operation, the gates of the first transistors TT1 of the further pairs of separation transistors TT1, TT2 are controlled by a first test signal Test1. During operation, the gates of the second transistors TT2 of the further pairs of separation transistors TT1, TT2 are controlled by a second test signal Test2. In the normal mode, both test signals Test1, Test2 have a potential at which the further pairs of separation transistors TT1, TT2 are made conducting (if the separation transistors TT1, TT2 are of the n-channel type, for instance, they have the typical supply potential VDD). If, in the test mode, a plurality or all of the memory cells SZ disposed on a selected word line WL are to be tested parallel to one another, then the information (data) stored in all of the memory cells SZ along this word line WL is read out simultaneously from all of the memory cells SZ on the internal bit line BL (or $\overline{BL}$, depending on whether the applicable memory cells SZ are connected to the bit lines BL or to the bit lines $\overline{BL}$) connected to the memory cells SZ. Next, the data that have been read out are weighted and amplified in the internal weighting circuits BWS. As a result of the weighting, the weighting circuits BWS flip into a state corresponding to the datum to be weighted, as is generally known. This process has already been described with respect to the first embodiments.

If, as is assumed in the example, a word line WL is triggered for a readout of the data from the memory cells SZ, the associated memory cells SZ of that line are connected to the internal bit lines BL, then after weighting, if the cell is good, each internal bit line BL will have the read-out datum (for instance, "logical 1", as is assumed for the ensuing description). Correspondingly, the internal bit lines $\overline{BL}$ have a datum (in the example: "logical 0") complementary thereto. The first external bit line XB of the external bit line pair XB, $\overline{XB}$, on which a logical 1 is expected if the cell is good, is precharged to logical 1 no later than this instant. The respective second external bit line $\overline{XB}$ can be precharged to logical 0. However, this is not necessary, as already explained for the first embodiments. Now, the first pairs of separation transistors TT are made conducting by means of the decoder DEC. The first test signal Test1 likewise assumes the value of logical 1, while the second test signal Test2 assumes the value of logical 0. If the cell is good, the first external bit line XB of the external bit line pair XB, $\overline{XB}$, that is accordingly precharged to logical 1, maintains its state attained by precharging, which is similar to the description already made in Published European Application 0 283 907 A1. In the case of error (that is, at least one of the internal bit lines BL has the datum logical 0), the potential of the first external bit line XB, originally precharged to logical 1, drops by the already-mentioned amount $\Delta U_{ERROR}$, to such an extent that an equilibrium is established over the remaining internal bit lines BL, which have the correct value, logical 1. During this process, the external weighting circuit BWSext is deactivated. A discriminator device DISC recognizes this drop and accordingly emits an error signal. This process is the same as has already been described for the first embodiments. The present second embodiments of the invention also prevent flipping of whichever internal weighting circuit BWS, having the associated memory cell SZ or associated internal bit line pair BL, $\overline{BL}$ at which the error occurred, to a state which (mistakenly) corresponds to the state that would be present if the cell were good. While in the first embodiments of the invention (see FIGS. 1, 2) the flipping is prevented by means of a separate triggering of the first separation transistors TT by means of the switch transistors ST, in the second embodiments of FIGS. 3, 4, the flipping is reliably prevented by the further separation transistors TT1, TT2. In the present case, this is prevented by the second further separation transistor TT2, because as a result of its triggering with the second test signal Test2=logical 0, it blocks. The blocking of the second further separation transistor TT2 is in turn the reason why it is again unnecessary in the second embodiments to precharge the second external bit line $\overline{XB}$ to logical 0.

A more-detailed description of the function and mode of operation of the second embodiments, in the event that memory cells SZ which are each connected to the second internal bit line $\overline{BL}$ are to be tested, will be omitted herein, because one skilled in the art will readily see that the above description logically applies for that case as well, by suitably changing the nomenclature (for instance, by replacing "the first set of internal bit lines $\overline{BL}$" with "the second set of internal bit lines $\overline{BL}$"; "the first set of external bit lines XB" with "the second set of external bit lines $\overline{XB}$"; and "the first separation transistor TT1 of the further pairs of separation transistors TT1, TT2" with "the second separation transistor TT2 of the further pairs of separation transistors TT1, TT2", and vice versa).

In the event that the memory cells SZ to be tested are intended to contain the value of logical 0, then as is also already described in Published European Application 0 283 907 A1, use is made of the effect that for each internal bit line pair BL, $\overline{BL}$ on whichever internal bit line is not connected to the particular memory cell SZ to be tested, a signal that is complementary to the read-out and amplified read signal, in other words in the event that the cell is good, forms a logical 1. Accordingly, in this case the second external bit line $\overline{XB}$ is precharged to logical 1. Furthermore the first test signal Test1 assumes the value of logical 0, as a result of which the first further separation transistors TT1 block, which in the case of an error prevents the already-described flipping. The second test signal Test2 has the value of logical 1.

From the above description pertaining to a test for logical 1, one skilled in the art can see on his own that if the cell is good, the second external bit line $\overline{XB}$ maintains its value of logical 1, and accordingly the discriminator will not generate any error signal, while in the case of error the second external bit line $\overline{XB}$ will be pulled in terms of potential in the direction of logical 0 by the alreadydescribed amount $\Delta U_{ERROR}$. This in turn is recognized by the discriminator device DISC, which correspondingly activates the error signal. Flipping of the applicable internal weighting circuit BWS is reliably precluded in this case as well. Due to the similarity to the testing for logical 1 that was already described, no further details need be given in this case.

FIG. 3 shows a first feature of the second embodiments, which is the advantageous disposition of the further pairs of separation transistors TT1, TT2 between the memory cell field MEM and the first pairs of separation transistors TT. However, in a second feature of the second embodiments, it is also advantageous, as shown in FIG. 4, to place the further pairs of separation transistors TT1, TT2 between the first pairs of separation transistors TT and the external bit line pair XB, $\overline{XB}$.

Figure 5:
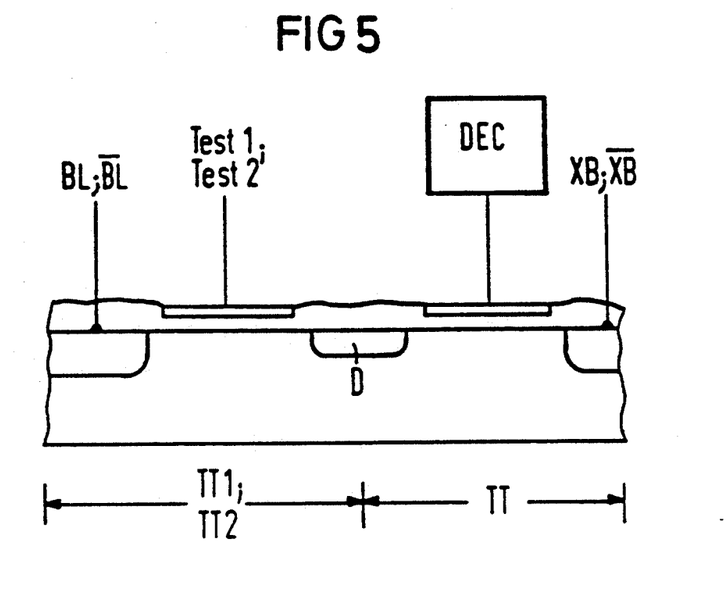
FIG. 5 is a fragmentary, diagrammatic, sectional view showing advantageous details of the invention.

It is also advantageous, because it saves space, to provide a further pair of separation transistors TT1, TT2 for each pair of separation transistors TT connected thereto, and to provide common diffusion zones D, a respective one of them acts as a source and drain zone for both transistors, TT1 and TT, on one hand, and the other respective one of them acts as a source and drain zone for both transistors, TT2 and TT, on the other hand. This is shown in FIG. 5.

In reducing the present invention to practice, in particular the second embodiments thereof, the lines of the test signals Test1, Test2 will extend largely parallel to the lines of the external bit line pair XB, $\overline{XB}$. It is advantageous to place the lines of the two Test signals Test1, Test2 in the form of shielding lines with respect to the lines of the external bit line pair XB, $\overline{XB}$ (FIG. 4). As has been explained for the embodiment of FIG. 2, the following also applies to the embodiment of FIG. 4: If the second external bit line $\overline{XB}$ (or XB) of the external bit line pair XB, $\overline{XB}$, whose precharging to logical 0 is unnecessary for the reasons given above, but for the aforementioned test purposes at a potential $U_{pO}$, which is lower that the value of logical 1 by half the value of $\Delta U_{ERROR}$ by which the first external bit line XB ($\overline{XB}$) precharged to logical 1 drops, as was already described, and if the external weighting circuit BWSext activates, then this circuit itself acts as the discriminator circuit DISC (see FIGS. 2, 4, 6) and flips into a state that corresponds to the error case, as a result of which its output acts as an error signal. Thus, in the second embodiments as well, a separate discriminator device DISC and any possibly necessary multiplexing circuit MUX can be dispensed with. This is shown in FIG. 4.

| List of reference symbols | |
|---|---|
| MEM | memory cell field |
| SZ | memory cell |
| WL | word line |
| BL, $\overline{BL}$ | pair of internal bit lines |
| BWS | internal weighting circuit |
| XB, $\overline{XB}$ | external bit line pair |
| BWSext | external weighting circuit |

| -continued | |
|---|---|
| List of reference symbols | |
| TT | pair of separation transistors |
| TT1, TT2 | further pair of separation transistors |
| ST | pair of switch transistors |
| DEC | decoder |
| $DEC_{BL}$ | decoder output |
| DISC | discriminator device |
| PC | precharging device |
| MUX | multiplexing circuit |
| Test1, Test2 | test signals |
| D | diffusion zone |
| $\Delta U_{ERROR}$ | potential difference in the case of error |
| $U_{p0}$ | precharging potential |

We claim:
1. An integrated semiconductor memory, comprising:
a memory cell field having memory cells disposed in matrix form, internal bit lines forming pairs of internal bit lines and word lines for addressing said memory cells, internal weighting circuits each being assigned to a respective one of said internal bit line pairs,
an external pair of bit lines being commonly assigned to said internal bit lines,
pairs of separation transistors each being assigned to a respective one of said internal bit line pairs for electrical separation of said respective internal bit line pair from said external pair of bit lines,
a bit line decoder for addressing said pairs of separation transistors,
an external weighting circuit assigned to said external bit line pair,
a discriminator device and a precharging device connected to said external bit line pair,
addressing means for addressing said internal bit lines of each pair of internal bit lines separately from one another, and
means for connecting said internal bit lines of each pair of internal bit lines to said external bit line pair separately from one another.

2. The integrated semiconductor memory according to claim 1, wherein said address means are part of said bit line decoder and operate as a function of a pair of test signals.

3. The integrated semiconductor memory according to claim 2, wherein said bit line decoder has a decoder line, and said address means include a pair of series-connected switch transistors having sources connected in common to said decoder line, drains connected to gates of said separation transistors, and gates connected to the pair of test signals, for separate triggering of said pairs of separation transistors.

4. The integrated semiconductor memory according to claim 1, wherein said separation transistors are first separation transistors, said address means trigger said transistors of each pair of first separation transistors in parallel with one another, and including pairs of second separation transistors each being assigned to a respective one of said pairs of first separation transistors for separate addressing of said internal bit lines of each pair of internal bit lines, each of said first separation transistors being connected in series with a respective one of said second separation transistors, and in each pair of second separation transistors, one transistor being controlled by a first test signal and another transistor being controlled by a second test signal.

5. The integrated semiconductor memory according to claim 4, wherein said pairs of second separation transistors are disposed between said memory cell field and said pairs of first separation transistors.

6. The integrated semiconductor memory according to claim 4, wherein said pairs of second separation transistors are disposed between said external bit line pair and said pairs of first separation transistors.

7. The integrated semiconductor memory according to claim 4, including a common diffusion zone acting as respective source and drain zones for one transistor of one of said pairs of second separation transistors and one transistor of one of said pairs of first separation transistors connected thereto.

8. The integrated semiconductor memory according to claim 5, including a common diffusion zone acting as respective source and drain zones for one transistor of one of said pairs of second separation transistors and one transistor of one of said pairs of first separation transistors connected thereto.

9. The integrated semiconductor memory according to claim 6, including a common diffusion zone acting as respective source and drain zones for one transistor of one of said pairs of second separation transistors and one transistor of one of said pairs of first separation transistors connected thereto.

10. The integrated semiconductor memory according to claim 2, including conductor tracks of said external bit line pair, and conductor tracks carrying the test signals and shielding with respect to said conductor tracks of said external bit line pair.

11. The integrated semiconductor memory according to claim 3, including conductor tracks of said external bit line pair, and conductor tracks carrying the test signals and shielding with respect to said conductor tracks of said external bit line pair.

12. The integrated semiconductor memory according to claim 4, including conductor tracks of said external bit line pair, and conductor tracks carrying the test signals and shielding with respect to said conductor tracks of said external bit line pair.

13. The integrated semiconductor memory according to claim 1, wherein in a test mode, one of said bit lines of said external bit line pair is precharged to logical 1, and the other of said bit lines of said external bit line pair is precharged to a potential being lower than the value of logical 1 by half an amount by which said one bit line of said external bit line pair precharged to logical 1 drops in the case of error.

* * * * *